United States Patent
Cao (10) Patent No.: US 12,315,799 B2
(45) Date of Patent: May 27, 2025

(54) SEMICONDUCTOR STRUCTURES OF ANTI-FUSE DEVICES AND CORE DEVICES WITH DIFFERENT DIELECTRIC LAYERS

(71) Applicant: CHANGXIN MEMORY TECHNOLOGIES, INC., Hefei (CN)

(72) Inventor: Xianlei Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/676,465

(22) Filed: May 28, 2024

(65) Prior Publication Data

US 2024/0312907 A1 Sep. 19, 2024

Related U.S. Application Data

(63) Continuation of application No. 17/465,099, filed on Sep. 2, 2021, now Pat. No. 12,033,938, which is a continuation of application No. PCT/CN2021/098897, filed on Jun. 8, 2021.

(30) Foreign Application Priority Data

Jan. 22, 2021 (CN) .......................... 202110086754.3

(51) Int. Cl.
*H01L 23/00* (2006.01)
*H01L 23/525* (2006.01)
*H01L 23/532* (2006.01)

(52) U.S. Cl.
CPC .... *H01L 23/5252* (2013.01); *H01L 23/53295* (2013.01)

(58) Field of Classification Search
CPC ... H01L 23/5252; H01L 23/52; H01L 23/525; H01L 23/522; H10B 10/18; H10B 12/50; H10B 20/60; H10B 20/65; H10B 41/40; H10B 41/30; H10B 41/35; H10B 43/40; H10B 43/30; H10B 43/35; H10B 51/40
See application file for complete search history.

(56) References Cited

U.S. PATENT DOCUMENTS

2015/0287730 A1* 10/2015 Wu .................. H10B 41/35
                                                         365/96
2020/0350213 A1* 11/2020 Ramkumar ............ H10B 43/40

* cited by examiner

*Primary Examiner* — Reema Patel
(74) *Attorney, Agent, or Firm* — Syncoda LLC; Feng Ma (57) ABSTRACT

A semiconductor structure includes: a core device region and an anti-fuse device region, disposed on a same substrate; a first dielectric layer, disposed on the substrate of the core device region and the anti-fuse device region, wherein the first dielectric layer has a first dielectric constant; a second dielectric layer, disposed on the first dielectric layer of the core device region; and a conductive layer, disposed on the second dielectric layer of the core device region and the first dielectric layer of the anti-fuse device region; wherein the second dielectric layer has a dielectric constant larger than the first dielectric constant.

18 Claims, 11 Drawing Sheets

SEMICONDUCTOR STRUCTURES OF ANTI-FUSE DEVICES AND CORE DEVICES WITH DIFFERENT DIELECTRIC LAYERS

CROSS-REFERENCE TO RELATED APPLICATIONS

This is a continuation of U.S. patent application Ser. No. 17/465,099 filed on Sep. 2, 2021, which is a continuation of International Patent Application No. PCT/CN2021/098897 filed on Jun. 8, 2021, which claims priority to Chinese Patent Application No. 202110086754.3 filed on Jan. 22, 2021. The disclosures of the above-referenced applications are hereby incorporated by reference in their entirety.

BACKGROUND

In the fields of computers, communications, etc., it is generally necessary to use semiconductor structures having different functions. The semiconductor structure generally includes an anti-fuse device structure and a core device structure. When not activated, the anti-fuse device structure does not conduct electricity. When activated (subjected to breakdown, metal diffusion, or transformation of amorphous silicon into polycrystalline silicon, etc.), the anti-fuse device structure may conduct electricity, so that two device structures electrically isolated are selectively conducted to change a circuit connection inside the semiconductor structure. The core device structure may be a transistor.

In some implementations, an anti-fuse device structure and a core device structure in a semiconductor structure are generally prepared simultaneously. During preparation, a substrate having a core device region and an anti-fuse device region outside the core device region is provided. A dielectric layer is then formed on the substrate. A conductive layer is then formed on the dielectric layer. The substrate, the dielectric layer and the conductive layer in the anti-fuse device region constitute the anti-fuse device structure. The substrate, the dielectric layer and the conductive layer in the device region constitute the core device structure.

However, since the dielectric layer in the anti-fuse device structure is generally thick, a programming voltage of the anti-fuse device structure turns out to be high.

SUMMARY

In view of this, embodiments of the disclosure provide a semiconductor structure, which are intended to solve the technical problem of high programming voltage of an anti-fuse device structure.

The disclosure relates to the technical field of semiconductors, and in particular to a semiconductor structure.

According to a first aspect of the embodiments of the disclosure, there is provided a semiconductor structure. The semiconductor structure may include: a core device region and an anti-fuse device region, disposed on a same substrate; a first dielectric layer, disposed on the substrate of the core device region and the anti-fuse device region, where the first dielectric layer has a first dielectric constant; a second dielectric layer, disposed on the first dielectric layer of the core device region; and a conductive layer, disposed on the second dielectric layer of the core device region and the first dielectric layer of the anti-fuse device region. The second dielectric layer may have a dielectric constant larger than the first dielectric constant.

The semiconductor structure provided by the disclosure has the following advantages.

In addition to the above-described technical problems to be solved by the embodiments of the disclosure, the technical features constituting the technical solutions, and the beneficial effects brought by the technical features of the technical solutions, other technical problems to be solved by the semiconductor structure provided by the disclosure, other technical features contained in the technical solutions, and the beneficial effects brought by the technical features will be explained in further detail in the detailed description.

DETAILED DESCRIPTION

A semiconductor structure generally includes an anti-fuse device structure and a core device structure. During preparation, a substrate having a core device region and an anti-fuse device region is provided. A dielectric layer and a conductive layer are then sequentially formed on the substrate. The substrate, the dielectric layer and the conductive layer in the anti-fuse device region constitute the anti-fuse device structure. The substrate, the dielectric layer and the conductive layer in the core device region constitute the core device structure. However, with the above-described method, the dielectric layer of the anti-fuse device structure is thick, and a programming voltage of the anti-fuse device structure is high.

An embodiment of the disclosure provides a preparation method of a semiconductor structure. A first dielectric layer and a second dielectric layer are sequentially formed on a substrate having a core device region and an anti-fuse device region. After the second dielectric layer on the anti-fuse device region is removed, a conductive layer is formed on the first dielectric layer on the anti-fuse device region and the second dielectric layer on the core device region. By removing the second dielectric layer on the anti-fuse device region, a film layer between the conductive layer and the substrate on the anti-fuse device region is thin and has a small dielectric constant, so that a programming voltage of a subsequently formed anti-fuse device structure is reduced. In addition, the second dielectric layer on the core device region is retained, and the second dielectric layer has a dielectric constant larger than a dielectric constant of the first dielectric layer, so that the film layer between the conductive layer and the substrate on the core device region is thick and has a large dielectric constant, thereby improving the reliability of a subsequently formed core device structure.

To more clarify the objects, technical solutions, and advantages of the embodiments of the disclosure, the technical solutions in the embodiments of the disclosure will be clearly and completely described below with reference to the drawings in the embodiments of the disclosure. It will be apparent that the described embodiments are some, but not all, embodiments of the disclosure. Based on the embodiments in the disclosure, all other embodiments obtained by those of ordinary skill in the art without involving any inventive effort are within the scope of protection of the disclosure.

First Embodiment

Figure 1:
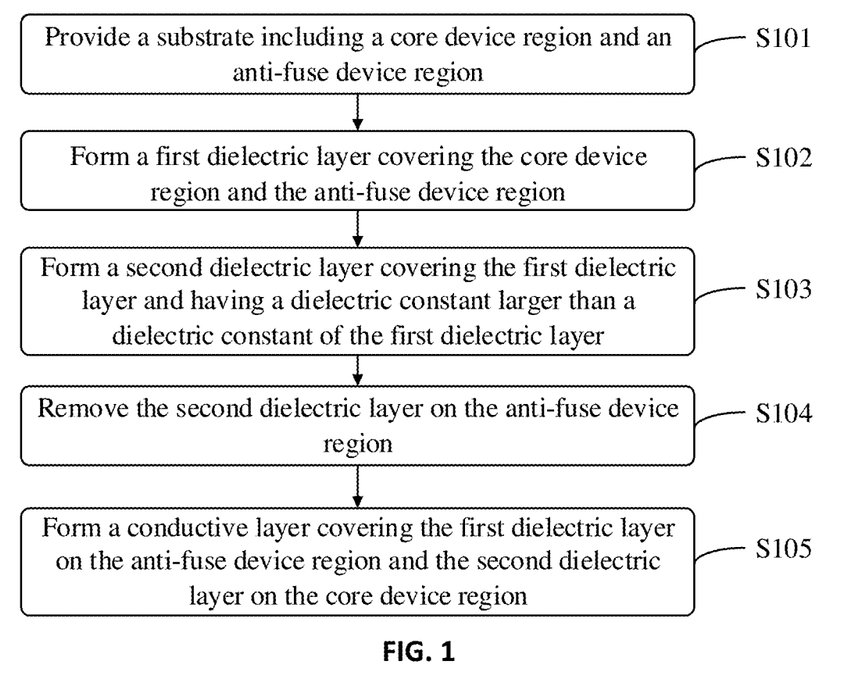
FIG. 1 is a flowchart of a preparation method of a semiconductor structure according to an embodiment of the disclosure.

Referring to FIG. 1, FIG. 1 is a flowchart of a preparation method of a semiconductor structure according to an embodiment of the disclosure. The preparation method may form an anti-fuse device structure having a thin dielectric layer to reduce a programming voltage of the anti-fuse device structure. The preparation method includes the following steps.

In step S101, a substrate including a core device region and an anti-fuse device region is provided.

Figure 2:
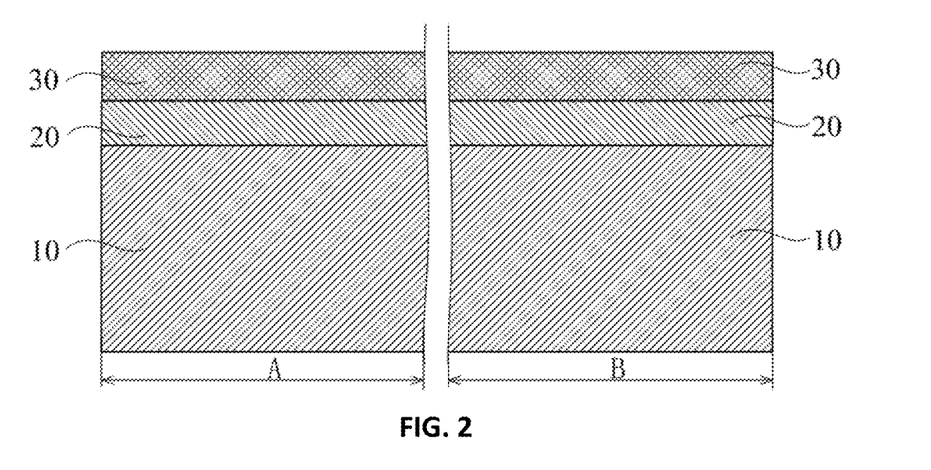
FIG. 2 is a schematic diagram of a semiconductor structure after a second dielectric layer is formed according to an embodiment of the disclosure.

Referring to FIG. 2, a substrate 10 in an embodiment of the disclosure includes a core device region and an anti-fuse device region that is located outside the core device region. Exemplarily, the anti-fuse device region, shown as part A in FIG. 2 and the core device region, shown as part B in FIG. 2 are spaced apart.

The substrate 10 may be a semiconductor substrate 10. In the embodiment of the disclosure, the substrate 10 may be a Silicon (Si) substrate. Certainly, the embodiment of the disclosure is not limited thereto. The substrate 10 may also be a Germanium (Ge) substrate, a Silicon on Insulator (SOI) substrate, a Silicon Germanide (SiGe) substrate, a Silicon Carbide (SiC) substrate, or a Gallium Nitride (GaN) substrate, etc.

In the embodiment of the disclosure, the substrate 10 in the core device region and various film layers located on the core device region may constitute a core device structure, such as a Metal Oxide Semiconductor (MOS) transistor. The substrate 10 in the anti-fuse device region and various layers located on the anti-fuse device region may constitute an anti-fuse device structure.

In step S102, a first dielectric layer covering the core device region and the anti-fuse device region is formed.

With continued reference to FIG. 2, a first dielectric layer 20 covers the core device region and the anti-fuse device region of the substrate 10. The first dielectric layer 20 may be made of an oxide, such as silicon oxide (SiO2). The first dielectric layer 20 may have a thickness of 0.5-5 nm.

The first dielectric layer 20 may be formed on the substrate 10 by a deposition process. For example, the first dielectric layer 20 may be formed on the substrate 10 by a CVD process, a Physical Vapor Deposition (PVD) process, or an Atomic Layer Deposition (ALD) process, etc.

The first dielectric layer 20 may also be formed on a surface of the substrate 10 by thermal oxidation treatment, that is, an upper part of the substrate 10 is formed into the first dielectric layer 20 by subjecting an upper surface of the substrate 10 shown in FIG. 2 to thermal oxidation treatment. For example, the first dielectric layer 20 is grown on the substrate 10 by an In-Situ Steam Generation (ISSG) process.

After forming the first dielectric layer 20, the first dielectric layer 20 may be subjected to nitrogen-containing annealing to form an oxynitride layer, such as a silicon oxynitride layer. In this way, the silicon oxynitride layer has better electrical performance, and a threshold voltage of the silicon oxynitride layer is smaller under the same thickness, so that a programming voltage of a subsequently formed anti-fuse device structure is reduced.

In step S103, a second dielectric layer covering the first dielectric layer and having a dielectric constant larger than a dielectric constant of the first dielectric layer is formed.

With continued reference to FIG. 2, a second dielectric layer 30 covers the first dielectric layer 20. Exemplarily, the second dielectric layer 30 may be formed on the first dielectric layer 20 corresponding to the core device region and the anti-fuse device region by CVD. The second dielectric layer 30 may have a thickness of 2 nm to 50 nm.

The second dielectric layer 30 has a dielectric constant larger than a dielectric constant of the first dielectric layer 20. Exemplarily, the first dielectric layer 20 may be a high dielectric constant layer having a dielectric constant of 10 to 100 and may be made of Hafnium Oxide ($HfO_2$) or Zirconium Oxide ($ZrO_2$), etc. In this way, a breakdown voltage of the second dielectric layer 30 may be improved to improve the reliability of a subsequently formed core device structure.

In step S104, the second dielectric layer on the anti-fuse device region is removed.

Figure 3:
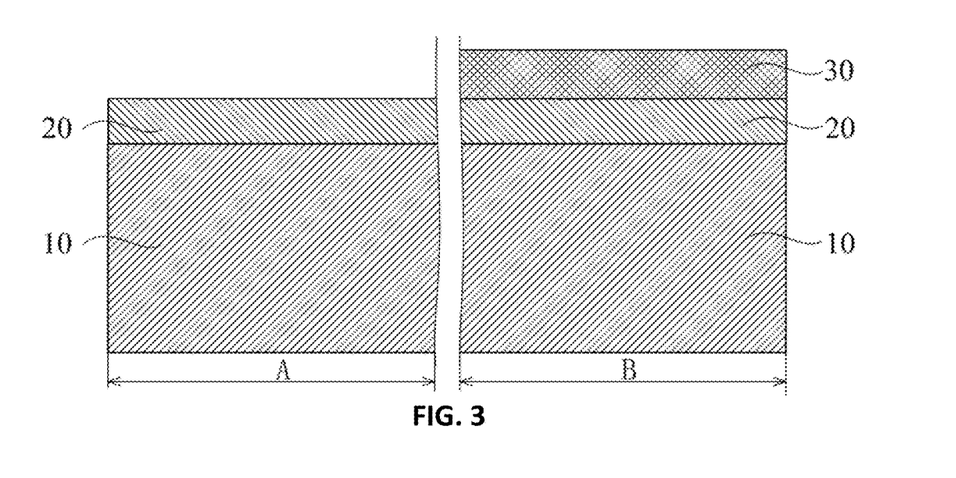
FIG. 3 is a schematic diagram of a semiconductor structure after a part of the second dielectric layer is removed according to an embodiment of the disclosure.

Referring to FIG. 3, the second dielectric layer 30 on the anti-fuse device region is removed, and the second dielectric layer 30 on the core device region is retained. For example, the second dielectric layer 30 on the anti-fuse device region is removed by dry etching or wet etching so that the first dielectric layer 20 is retained on the anti-fuse device region.

After removing of a part of the second dielectric layer 30, the thickness of a film layer (the first dielectric layer 20) on the anti-fuse device region is smaller than that of a film layer (the first dielectric layer 20 and the second dielectric layer 30) on the core device region, and a dielectric constant of the film layer on the anti-fuse device region is smaller than that of the film layer on the core device region, so that the programming voltage of the subsequently formed anti-fuse device structure is low, and the breakdown voltage of the core device structure is high.

In step S105, a conductive layer covering the first dielectric layer on the anti-fuse device region and the second dielectric layer on the core device region is formed.

A conductive layer is deposited on the first dielectric layer 20 on the anti-fuse device region and the second dielectric layer 30 on the core device region. The conductive layer may be a metal layer, and may be made of one or more of Titanium (Ti), Aluminum (Al), Tungsten (W), Nickel (Ni), and Cobalt (Co). For example, the conductive layer is a $TiN_x$ film or an $AlN_x$ film.

Exemplarily, the conductive layer may be formed by the following process. A metal layer is formed. The metal layer is evaporated, sputtered, or formed by CVD on the first dielectric layer on the anti-fuse device region and on the second dielectric layer on the core device region. The metal layer is then planarized so that a surface of the metal layer away from the substrate 10 is flush. For example, the above-described metal layer is planarized by a Chemical Mechanical Polishing (CMP) process.

Figure 7:
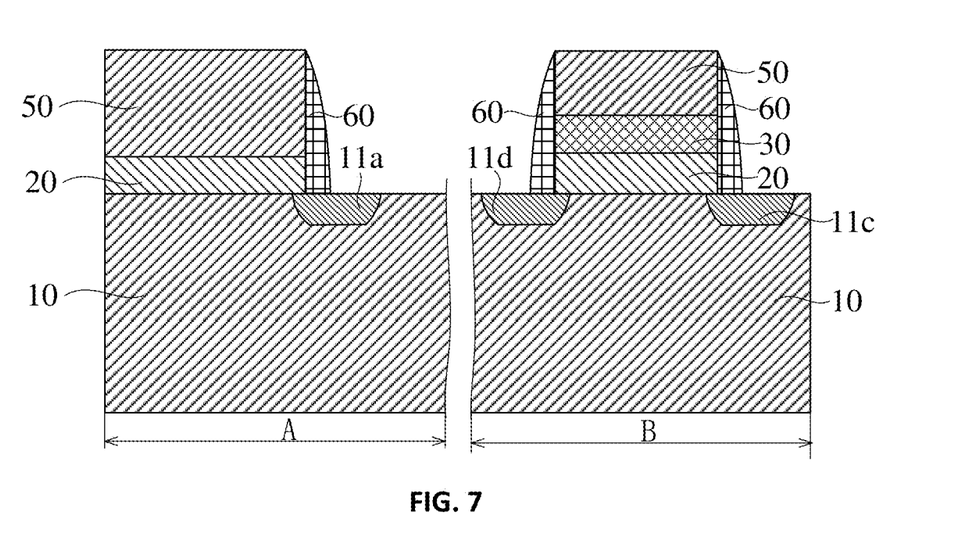
FIG. 7 is a schematic diagram of a first semiconductor structure according to an embodiment of the disclosure.

Referring to FIG. 7, the substrate 10 of the anti-fuse device region, and the first dielectric layer 20 and the conductive layer 50 on the anti-fuse device region form the anti-fuse device structure in the embodiment of the disclosure. The substrate 10 of the core device region, and the first dielectric layer 20, the second dielectric layer 30 and the conductive layer 50 on the core device region form the core device structure in the embodiment of the disclosure.

According to the preparation method of the semiconductor structure provided by the embodiment of the disclosure, a substrate 10 having a core device region and an anti-fuse device region is provided. A first dielectric layer 20 and a second dielectric layer 30 are then sequentially formed on the substrate 10. The first dielectric layer 20 covers the core device region and the anti-fuse device region. The second dielectric layer 30 covers the first dielectric layer 20, and the second dielectric layer 30 has a dielectric constant larger than a dielectric constant of the first dielectric layer 20. The second dielectric layer 30 on the anti-fuse device region is then removed, and the second dielectric layer 30 on the core device region is retained. A conductive layer 50 is then formed on the first dielectric layer 20 on the anti-fuse device region and the second dielectric layer 30 on the core device region. By removing the second dielectric layer 30 on the anti-fuse device region, a film layer between the conductive layer 50 and the substrate 10 on the anti-fuse device region is thin and has a small dielectric constant, so that a programming voltage of a subsequently formed anti-fuse device structure is reduced. In addition, the second dielectric layer 30 on the core device region is retained, and the second dielectric layer 30 has a dielectric constant larger than a dielectric constant of the first dielectric layer 20, so that the film layer between the conductive layer 50 and the substrate 10 on the core device region is thick and has a large dielectric constant, thereby improving the reliability of a subsequently formed core device.

It should be noted that in the embodiment of the disclosure, referring to FIGS. 4 to 7, after the step of removing the second dielectric layer 30 on the anti-fuse device region and before the step of forming the conductive layer 50, the preparation method of the semiconductor structure further includes the following steps.

Figure 4:
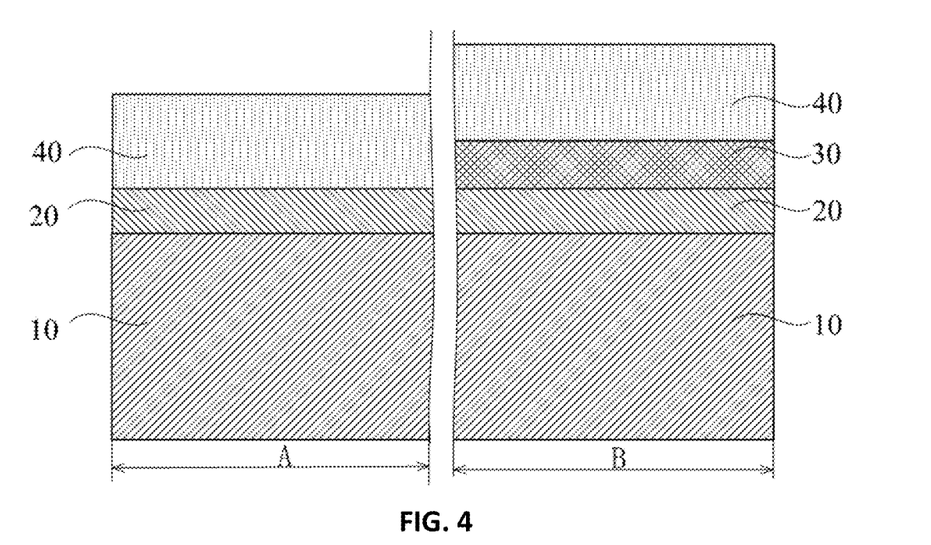
FIG. 4 is a schematic diagram of a semiconductor structure after a sacrificial layer is formed according to an embodiment of the disclosure.

A sacrificial layer 40 covering the first dielectric layer 20 on the anti-fuse device region and the second dielectric layer 30 on the core device region is formed. Referring to FIG. 4, the sacrificial layer 40 may be formed on the first dielectric layer 20 on the anti-fuse device region and the second dielectric layer 30 on the core device region by CVD. The sacrificial layer 40 may be made of polycrystalline silicon.

After forming the sacrificial layer 40, a part of the sacrificial layer 40 and a part of the first dielectric layer 20 on the anti-fuse device region are removed, and a part of the sacrificial layer 40, a part of the second dielectric layer 30 and a part of the first dielectric layer 20 on the core device region are removed.

Exemplarily, the step of removing a part of the sacrificial layer 40 and a part of the first dielectric layer 20 on the anti-fuse device region and removing a part of the sacrificial layer 40, a part of the second dielectric layer 30 and a part of the first dielectric layer 20 on the core device region includes the following operations. A mask layer covering the sacrificial layer 40 is formed. The sacrificial layer 40 and the first dielectric layer 20 on the anti-fuse device region are then etched away, and the sacrificial layer 40, the second dielectric layer 30 and the first dielectric layer 20 on the core device region are etched away. The mask layer is removed.

Figure 5:
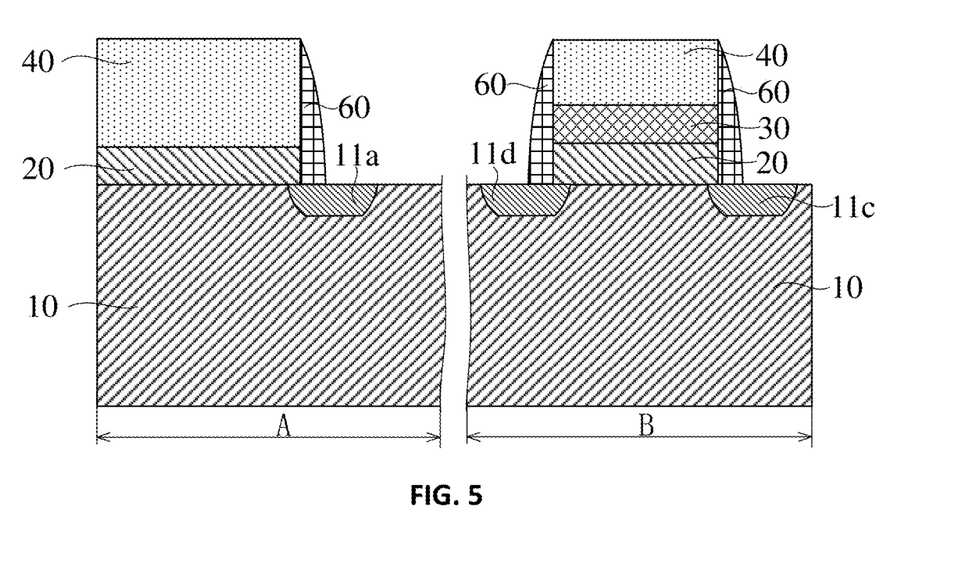
FIG. 5 is a schematic diagram of a semiconductor structure after a part of the sacrificial layer is removed according to an embodiment of the disclosure.

The sacrificial layer 40 and the first dielectric layer 20 on the anti-fuse device region are etched away. As shown in FIG. 5, right parts of the sacrificial layer 40 and the first dielectric layer 20 on the anti-fuse device region are etched away to expose the substrate 10 of the anti-fuse device region, and required patterns are formed on the sacrificial layer 40 and the first dielectric layer 20 corresponding to the anti-fuse device region, so as to facilitate subsequent formation of the anti-fuse device structure.

The sacrificial layer 40, the second dielectric layer 30 and the first dielectric layer 20 on the core device region are etched away simultaneously. As shown in FIG. 5, left and right parts of the sacrificial layer 40, the second dielectric layer 30 and the first dielectric layer 20 on the core device region are etched away to expose the substrate 10 of the core device region, and required patterns are formed on the sacrificial layer 40, the second dielectric layer 30 and the first dielectric layer 20 corresponding to the core device region, so as to facilitate subsequent formation of the core device structure.

It will be appreciated that in the step of removing a part of the sacrificial layer 40 and a part of the first dielectric layer 20 on the anti-fuse device region and removing a part of the sacrificial layer 40, a part of the second dielectric layer 30 and a part of the first dielectric layer 20 on the core device region, single-side parts, e.g. right parts, of the sacrificial layer 40 and the first dielectric layer 20 on the anti-fuse device region may be removed to form a structure shown in FIG. 5. Two-side parts, e.g. left and right parts, of the sacrificial layer 40 and the first dielectric layer 20 on the anti-fuse device region may also be removed to form a structure shown in FIG. 11.

Figure 6:
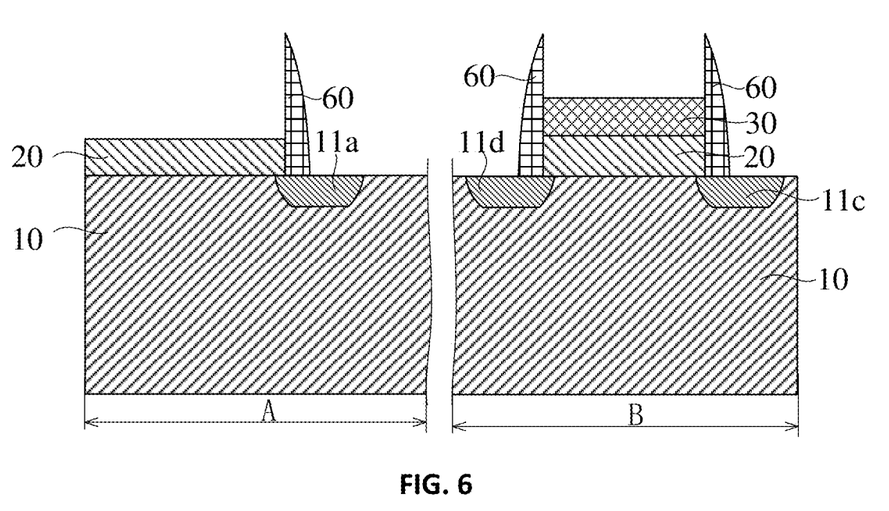
FIG. 6 is a schematic diagram of a semiconductor structure after remaining parts of the sacrificial layer is removed according to an embodiment of the disclosure.

After removing a part of the sacrificial layer 40 and a part of the first dielectric layer 20 on the anti-fuse device region and removing a part of the sacrificial layer 40, a part of the second dielectric layer 30 and a part of the first dielectric layer 20 on the core device region, remaining parts of the sacrificial layer 40 is removed, and the first dielectric layer 20 on the anti-fuse device region and the second dielectric layer 30 on the core device region are exposed. Referring to FIG. 6, the sacrificial layer 40 on the anti-fuse device region is removed, and the first dielectric layer 20 on the anti-fuse device region is exposed. The sacrificial layer 40 on the core device region is removed, and the second dielectric layer 30 on the core device region is exposed.

In some possible examples, before the step of removing remaining parts of the sacrificial layer 40, the preparation method of the semiconductor structure further includes the following steps.

First, a silicide layer covering the substrate 10 and the sacrificial layer 40 is formed.

Then, an ILD layer covering the silicide layer is formed.

And then, the silicide layer and the ILD layer are planarized to expose the sacrificial layer 40 corresponding to the core device region and the anti-fuse device region.

It should be noted that referring to FIG. 5, after the step of removing a part of the sacrificial layer 40 and a part of the first dielectric layer 20 on the anti-fuse device region and removing a part of the sacrificial layer 40, a part of the second dielectric layer 30 and a part of the first dielectric layer 20 on the core device region, the preparation method of the semiconductor structure in the embodiment of the disclosure further includes the following steps.

Side walls 60 covering side surfaces of the first dielectric layer 20 and the sacrificial layer 40 on the anti-fuse device region and covering side surfaces of the first dielectric layer 20, the second dielectric layer 30 and the sacrificial layer 40 on the core device region are formed.

As shown in FIG. 5, side walls 60 are respectively formed on the side surfaces of the first dielectric layer 20 and the sacrificial layer 40 on the anti-fuse device region and the side surfaces of the first dielectric layer 20, the second dielectric layer 30 and the sacrificial layer 40 on the core device region to protect and support film layers located between the side walls 60.

Figure 11:
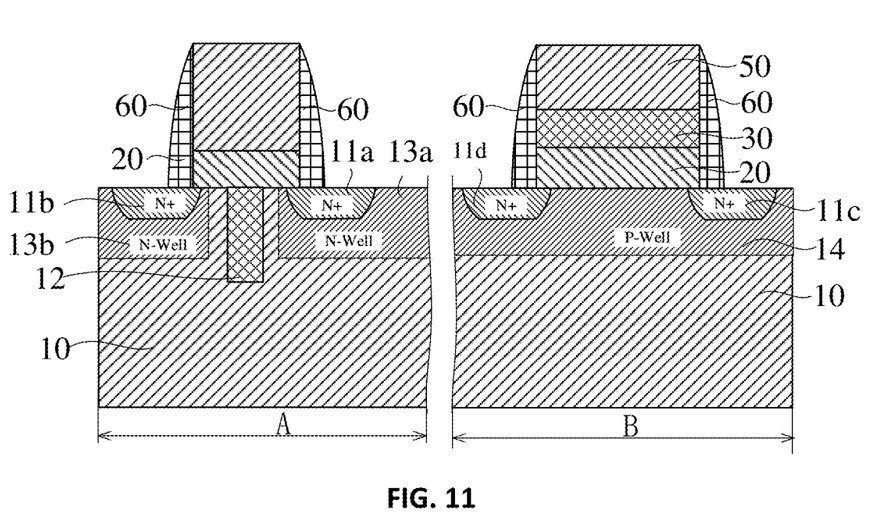
FIG. 11 is a schematic diagram of a fifth semiconductor structure according to an embodiment of the disclosure.

It should be noted that the side walls 60 may be formed on a single side of the first dielectric layer 20 on the anti-fuse device region as shown in FIG. 5, the side walls 60 may also be formed on two sides of the first dielectric layer 20 on the anti-fuse device region as shown in FIG. 11, and the side walls 60 may be disposed according to design requirements.

As shown in FIG. 7, after the conductive layer 50 is subsequently formed, the side walls 60 are in contact with the side surfaces of the first dielectric layer 20 and the conductive layer 50 on the anti-fuse device region, and the side surfaces of the first dielectric layer 20, the second dielectric layer 30 and the conductive layer 50 on the core device region.

It should be noted that referring to FIG. 5, after the step of removing a part of the sacrificial layer 40 and a part of the first dielectric layer 20 on the anti-fuse device region and removing a part of the sacrificial layer 40, a part of the second dielectric layer 30 and a part of the first dielectric layer 20 on the core device region, the preparation method of the semiconductor structure in the embodiment of the disclosure further includes the following steps.

Doped regions (specifically including a first doped region 11a, a third doped region 11b, a fifth doped region 11c, and a sixth doped region 11d) are formed. The fifth doped region 11c and the sixth doped region 11d of the core device region are located on two sides of the first dielectric layer 20 on the core device region and are in contact with the first dielectric layer 20. The first doped region 11a and the third doped region 11b of the anti-fuse device region are located on one or two sides of the first dielectric layer 20 on the anti-fuse device region and are in contact with the first dielectric layer 20.

As shown in FIG. 7, the first doped region 11a of the anti-fuse device region may be located on a right side of the first dielectric layer 20 on the anti-fuse device region and be in contact with the first dielectric layer 20. Or as shown in FIG. 11, the first doped region 11a and the third doped region 11b of the anti-fuse device region may be located on left and right sides of the first dielectric layer 20 on the anti-fuse device region and be in contact with the first dielectric layer 20.

The doped regions (specifically including the first doped region 11a, the third doped region 11b, the fifth doped region 11c, and the sixth doped region 11d) may be formed by implanting ions into the substrate 10. Exemplarily, the substrate 10 may be a P-type substrate 10, and the first doped region 11a, the third doped region 11b, the fifth doped region 11c, and the sixth doped region 11d are formed by implanting N-type ions into the substrate 10. The first doped region 11, the third doped region 11b, the fifth doped region 11c, and the sixth doped region 11d may be formed after the side walls 60, i.e., the side walls 60 are formed before the first doped region 11, the third doped region 11b, the fifth doped region 11c, and the sixth doped region 11d are formed.

Figure 9:
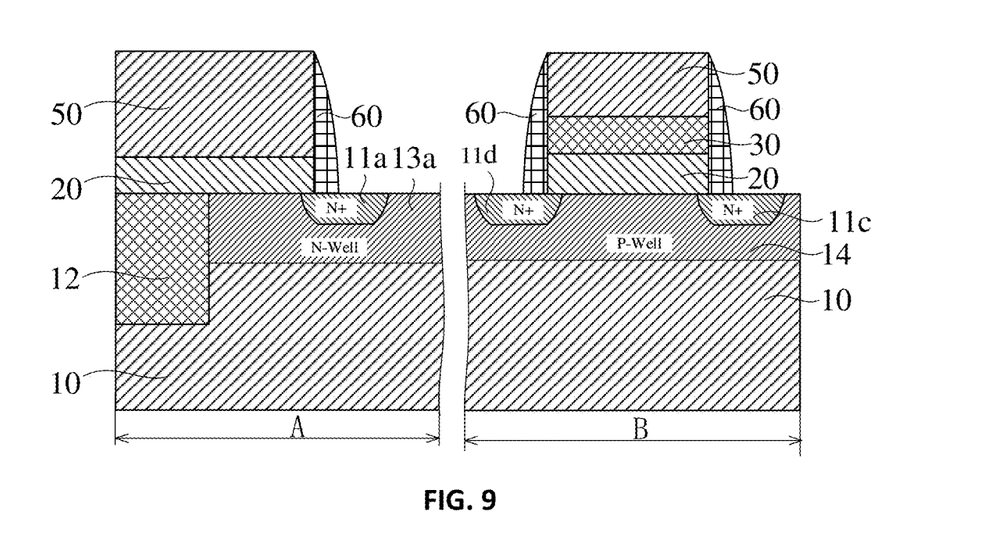
FIG. 9 is a schematic diagram of a third semiconductor structure according to an embodiment of the disclosure.
Figure 10:
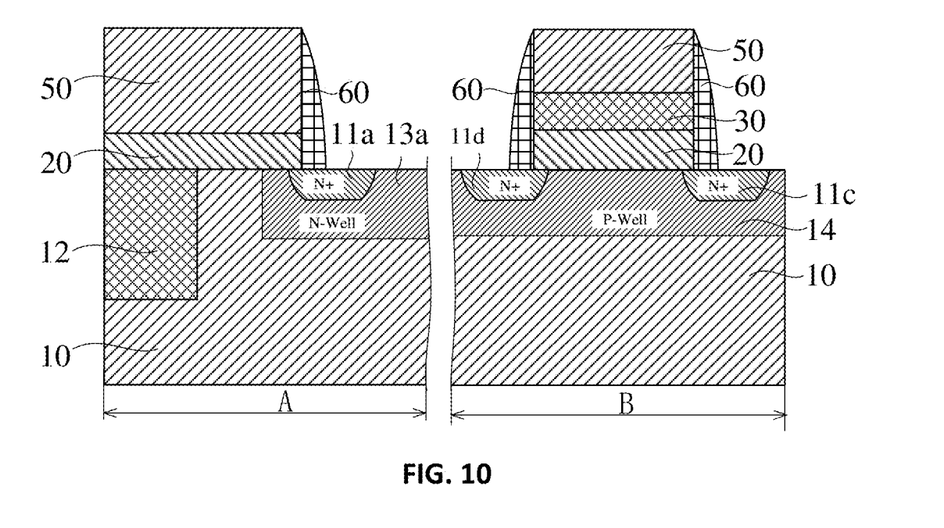
FIG. 10 is a schematic diagram of a fourth semiconductor structure according to an embodiment of the disclosure.

Referring to FIGS. 9 to 11, a well may be formed in the substrate 10, a seventh doped region 14 (such as a P-well 14) may be formed in the substrate 10 located in the core device region, and a second doped region 13a (such as an N-well 13a) and a fourth doped region 13b (such as an N-well 13b) may be formed in the substrate 10 located in the anti-fuse device region. The first doped region 11a, the third doped region 11b, the fifth doped region 11c, and the sixth doped region 11d may be N-type doped regions, and the N-type doped regions are located in the well, specifically, the first doped region 11a (N-type) is located in the N-well 13a, the third doped region 11b (N-type) is located in the N-well 13b, the fifth doped region 11c (N-type) and the sixth doped region 11d (N-type) are located in the P-well 13b.

Referring to FIGS. 8-11, the substrate 10 in the embodiment of the disclosure may further include an STI structure 12. The STI structure 12 is disposed on the anti-fuse device region of the substrate 10 and is in contact with the first dielectric layer 20 corresponding to the anti-fuse device region.

The STI structure 12 is used to isolate the second doped region 13a (such as the N-well 13a) and the fourth doped region 13b (such as the N-well 13b) in the anti-fuse device region of the substrate 10. The STI structure 12 may be in contact with the second doped region 13a (such as the N-well 13a) as shown in FIG. 9, and may be spaced apart therefrom as shown in FIG. 10. When the STI structure 12 and the second doped region 13a (such as the N-well 13a) are disposed as shown in FIG. 10, a breakdown point of the subsequently formed anti-fuse structure is located at a contact of the first doped region 11a and the first dielectric layer 20, so that the resistance consistency of an anti-fuse structure after breakdown is good.

In some possible examples, referring to FIG. 10, the anti-fuse device region is provided with a first doped region 11a, the first dielectric layer 20 of the anti-fuse device region is located between the STI structure 12 and the first doped region 11a of the anti-fuse device region, and two sides of the first dielectric layer 20 are in contact with the STI structure 12 and the first doped region 11a, respectively. The first doped region 11a is disposed in the second doped region 13a (such as the N-well 13a), and the second doped region 13a (such as the N-well 13a) is spaced apart from the STI structure 12. A side of the first dielectric layer 20 corresponding to the first doped region 11a is provided with the side walls 60 in contact therewith.

In other possible examples, as shown in FIG. 11, the anti-fuse device region is provided with two doped regions (specifically including a first doped region 11a and a third doped region 11b), and the STI structure 12 is disposed between the first doped region 11a and the third doped region 11b. The first dielectric layer 20 of the anti-fuse device region is located between the first doped region 11a and the third doped region 11b, two sides of the first dielectric layer 20 are respectively in contact with the first doped region 11a and the third doped region 11b, and a middle part of the first dielectric layer 20 is in contact with the STI structure 12. The first doped region 11a and the third doped region 11b are respectively disposed in the corresponding second doped region 13a (such as the N-well 13a) and the fourth doped region 13b (such as the N-well 13b), and the second doped region 13a and the fourth doped region 13b are spaced apart from the STI structure 12. Two sides of the first dielectric layer 20 are provided with the side walls 60 in contact therewith. In this way, two anti-fuse structures sharing the first dielectric layer 20 and the conductive layer 50 may be formed to increase the number of anti-fuse structures.

Second Embodiment

Figure 8:
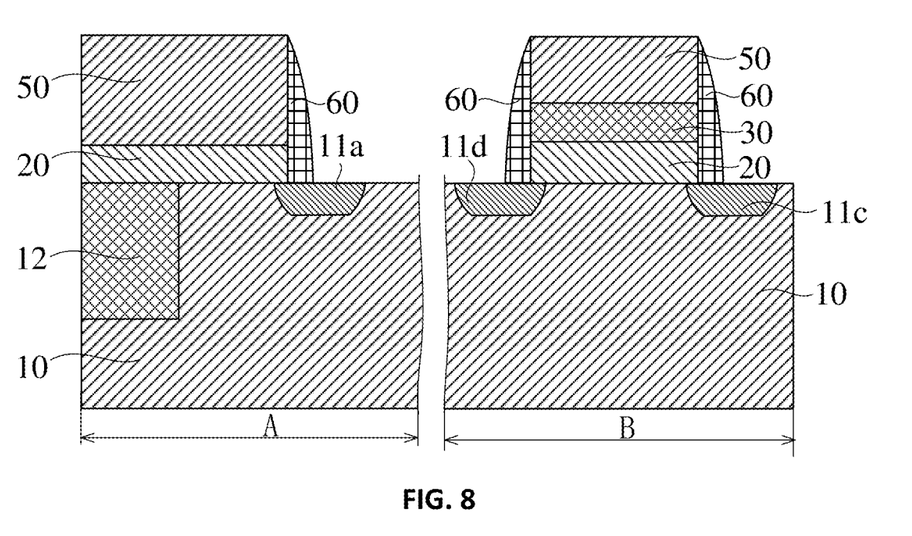
FIG. 8 is a schematic diagram of a second semiconductor structure according to an embodiment of the disclosure.

Referring to FIG. 8, an embodiment of the disclosure provides a semiconductor structure including a core device region and an anti-fuse device region. The core device region and the anti-fuse device region are disposed on a same substrate 10. The anti-fuse device region may be located outside the core device region. Exemplarily, the anti-fuse device region which may be shown as part A in FIG. 8 and the core device region which may be shown as part B in FIG. 8 are spaced apart.

The substrate 10 may be a semiconductor substrate. Exemplarily, the substrate 10 may be a Si substrate, a Ge substrate, an SOI substrate, a SiGe substrate, a SiC substrate, or a GaN substrate, etc. As shown in FIG. 8, doped regions (specifically comprising the first doped region 11, the fifth doped region 11c, and the sixth doped region 11d) are also formed in the substrate 10.

The doped regions (specifically comprising the first doped region 11, the third doped region 11b, the fifth doped region 11c, and the sixth doped region 11d) may be formed by implanting ions into the substrate 10. Exemplarily, the substrate 10 may be a P-type substrate 10, and the first doped region 11a, the third doped region 11b, the fifth doped region 11c, and the sixth doped region 11d are formed by doping N-type ions into the substrate 10 by an ion implantation process. As shown in FIG. 8, the first doped region 11a is formed on an upper surface of the substrate 10 of the anti-fuse device region, and the fifth doped region 11c and the sixth doped region 11d are formed on an upper surface of the substrate 10 of the core device region.

It should be noted that referring to FIG. 9, a well may be formed in the substrate 10, a seventh doped region 14 (such as a P-well 14) may be formed in the substrate 10 located in the core device region, and a second doped region 13a (such as an N-well 13a) may be formed in the substrate 10 located in the anti-fuse device region. The first doped region 11a, the fifth doped region 11c, and the sixth doped region 11d may be N-type doped regions, and the N-type doped regions are located in the well, specifically, the first doped region 11a (N-type) is located in the N-well 13a, the fifth doped region 11c (N-type) and the sixth doped region 11d (N-type) are located in the P-well 13b.

It should be noted that an STI structure 12 may also be formed in the substrate 10 of the anti-fuse device region. As shown in FIGS. 8-11, the STI structure 12 is disposed in the anti-fuse device region of the substrate 10 and is exposed to a surface of the substrate 10.

The STI structure 12 may be in contact with the second doped region 13a (such as the N-well 13a) of the substrate 10 as shown in FIG. 9, and may be spaced apart therefrom as shown in FIG. 10. When the STI structure 12 and the second doped region 13a (such as the N-well 13a) of the substrate 10 are disposed as shown in FIG. 10, a breakdown point of a subsequently formed anti-fuse structure is located at a contact of the first doped region 11a and a first dielectric layer 20, so that the resistance consistency of an anti-fuse structure after breakdown is good.

With continued reference to FIG. 8, the substrate 10 is provided with a first dielectric layer 20. The first dielectric layer 20 is in contact with the doped regions (specifically including the first doped region 11a, the fifth doped region 11c, and the sixth doped region 11d), i.e. the first dielectric layer 20 on the anti-fuse device region covers a part of the first doped region 11a and the first dielectric layer 20 on the core device region covers a part of the fifth doped region 11c and the sixth doped region 11d. The first doped region 11a of the anti-fuse device region is located on one side of the first dielectric layer 20 on the anti-fuse device region and is in contact with the first dielectric layer 20. The fifth doped region 11c and the sixth doped region 11d of the core device region are located on two sides of the first dielectric layer 20 on the core device region and are in contact with the first dielectric layer 20.

In some possible examples, referring to FIG. 10, the anti-fuse device region is provided with a doped region (such as a first doped region 11), the first dielectric layer 20 of the anti-fuse device region is located between the STI structure 12 and the first doped region 11a of the anti-fuse device region, and two sides of the first dielectric layer 20 are in contact with the STI structure 12 and the first doped region 11a, respectively. The first doped region 11a is disposed in the second doped region 13a (such as an N-well 13a), and the second doped region 13a (such as an N-well 13a) is spaced apart from the STI structure 12.

In other possible examples, as shown in FIG. 11, the anti-fuse device region is provided with two doped regions (such as a first doped region 11a and a third doped region 11b), and the STI structure 12 is disposed between the first doped region 11a and the third doped region 11b. The first dielectric layer 20 of the anti-fuse device region is located between the first doped region 11a and the third doped region 11b, two sides of the first dielectric layer 20 are respectively in contact with the first doped region 11a and the third doped region 11b respectively, and a middle part of the first dielectric layer 20 is in contact with the STI structure 12. The first doped region 11a and the third doped region 11b are respectively disposed in the corresponding second doped region 13a (such as the N-well 13a) and the fourth doped region 13b (such as the N-well 13b), and the second doped region 13a and the fourth doped region 13b are spaced apart from the STI structure 12. In this way, two anti-fuse structures sharing the first dielectric layer 20 and the conductive layer 50 may be formed to increase the number of anti-fuse structures.

The first dielectric layer 20 may be made of silicon oxide, silicon nitride or silicon oxynitride. The first dielectric layer 20 may have a thickness of 0.5 nm to 50 nm. The first dielectric layer 20 may be formed on the upper surface of the substrate 10 by thermal oxidation treatment or formed on the substrate 10 by a deposition process.

With continued reference to FIG. 8, a second dielectric layer 30 is disposed on the first dielectric layer 20 corresponding to the core device region, and the second dielectric layer 30 may have a thickness of 2 nm to 50 nm. The second dielectric layer 30 has a dielectric constant larger than a first dielectric constant, i.e., the second dielectric layer 30 may be a high dielectric constant layer having a dielectric constant of 10 to 100. The second dielectric layer 30 may be made of $ZrO_2$ or $HfO_2$, etc.

A conductive layer 50 is disposed on the first dielectric layer 20 corresponding to the anti-fuse device region and the second dielectric layer 30 corresponding to the core device region. An upper surface of the conductive layer 50 corresponding to the anti-fuse device region as shown in FIG. 8 may be flush with an upper surface of the conductive layer 50 corresponding to the core device region.

The conductive layer 50 may be a metal layer, and the conductive layer 50 may be made of one or more of Ti, Al, W, Ni, and Co. For example, the conductive layer 50 is a $TiN_x$ film or an $AlN_x$ film.

It should be noted that referring to FIG. 8, the semiconductor structure in the embodiment of the disclosure may further include side walls 60. The side walls 60 are formed on side surfaces of the first dielectric layer 20 and the conductive layer 50 on the anti-fuse device region and side surfaces of the first dielectric layer 20, the second dielectric layer 30 and the conductive layer 50 on the core device region to protect and support film layers in the side walls 60.

The side walls 60 cover the part of the doped region (specifically including the first doped region 11a, the third doped region 11b, the fifth doped region 11c, and the sixth doped region 11d), and a part of the doped region (specifically including the first doped region 11a, the third doped region 11b, the fifth doped region 11c, and the sixth doped region 11d) away from the first dielectric layer 20 is exposed outside the side walls 60, so as to ensure that the formed core device structure and anti-fuse device structure may work normally.

It should be noted that the side walls 60 may be located on a single side of the first dielectric layer 20 on the anti-fuse device region as shown in FIG. 10, or may also be formed on two sides of the first dielectric layer 20 on the anti-fuse device region as shown in FIG. 11. The side walls 60 may be disposed according to design requirements.

As shown in FIG. 8, the substrate 10 of the anti-fuse device region, and the first dielectric layer 20 and the conductive layer 50 on the anti-fuse device region form the anti-fuse device structure in the embodiment of the disclosure. The substrate 10 of the core device region, and the first dielectric layer 20, the second dielectric layer 30 and the conductive layer 50 on the core device region form the core device structure in the embodiment of the disclosure.

The semiconductor structure provided by the embodiment of the disclosure includes: a core device region and an anti-fuse device region formed on the same substrate 10, a first dielectric layer 20 disposed on the substrate 10 of the core device region and the anti-fuse device region, a second dielectric layer 30 disposed on the first dielectric layer 20 corresponding to the core device region, and a conductive layer 50 disposed on the second dielectric layer 30 corresponding to the core device region and the first dielectric layer 20 corresponding to the anti-fuse device region. The second dielectric layer 30 has a dielectric constant larger than a first dielectric constant. Therefore, a film layer between the conductive layer 50 and the substrate 10 on the anti-fuse device region is thin and has a small dielectric constant, so that a programming voltage of a subsequently formed anti-fuse device structure is reduced. In addition, the film layer between the conductive layer 50 and the substrate 10 on the core device region is thick and has a large dielectric constant, so that the reliability of a subsequently formed core device is improved.

The embodiments or implementations described in this specification are described in an incremental manner, with each embodiment being described with emphasis on differences from the other embodiments, and with reference to like parts throughout the various embodiments.

Those skilled in the art will appreciate that in the disclosure of the disclosure, orientation or positional relationships indicated by the terms "longitudinal", "transverse", "upper", "lower", "front", "rear", "left", "right", "vertical", "horizontal", "top", "bottom", "inner", "outer", etc. are based on the orientation or positional relationships shown in the drawings, which are merely intended to facilitate describing the disclosure and to simplify the description rather than indicating or implying that the referenced system or element must have a particular orientation and be constructed and operated in a particular orientation. Therefore, the above terms are not to be construed as limiting the disclosure.

In the descriptions of this specification, the description with reference to the terms "one implementation", "some implementations", "schematic implementations", "example", "specific example", or "some examples", etc. means that particular features, structures, materials, or characteristics described in conjunction with the implementation or example are included in at least one implementation or example of the disclosure. In this specification, schematic representations of the above terms do not necessarily refer to the same implementation or example. Furthermore, the particular features, structures, materials, or characteristics described may be combined in any suitable manner in any one or more implementations or examples.

Finally, it should be noted that the above embodiments are merely illustrative of the technical solutions of the disclosure and are not intended to be limiting thereof. Although the disclosure has been described in detail with reference to the foregoing embodiments, those of ordinary skill in the art will appreciate that the technical solutions of the foregoing embodiments may still be modified, or some or all of the technical features thereof may be equivalently replaced. These modifications or replacements do not make the essence of the corresponding technical solutions depart from the scope of the technical solutions of the various embodiments of the disclosure.

The invention claimed is:

1. A semiconductor structure, comprising:
 a core device region and an anti-fuse device region, disposed on a same substrate;
 a first dielectric layer, disposed on the substrate of the core device region and the anti-fuse device region, wherein the first dielectric layer has a first dielectric constant;
 a second dielectric layer, disposed on the first dielectric layer of the core device region; and
 a conductive layer, disposed on the second dielectric layer of the core device region and the first dielectric layer of the anti-fuse device region,
 wherein the second dielectric layer has a dielectric constant larger than the first dielectric constant;
 the semiconductor structure further comprising:
 a first doped region, disposed in the substrate of the anti-fuse device region, and located on one side of the first dielectric layer of the anti-fuse device region; and
 a Shallow Trench Isolation (STI) structure, disposed in the substrate of the anti-fuse device region; wherein the first dielectric layer of the anti-fuse device region is located between the STI structure and the first doped region.

2. The semiconductor structure of claim 1, wherein a method of forming the second dielectric layer disposed on the first dielectric layer of the core device region comprising: forming the second dielectric layer covering the first dielectric layer, and removing the second dielectric layer on the anti-fuse device region to remain the second dielectric layer to be disposed on the first dielectric layer of the core device region.

3. The semiconductor structure of claim 1, further comprising:
 a second doped region, located in the substrate of the anti-fuse device region; wherein the first doped region is disposed in the second doped region.

4. The semiconductor structure of claim 3, wherein the STI structure is spaced apart from the second doped region.

5. The semiconductor structure of claim 1, wherein the first doped region is in contact with the first dielectric layer of the anti-fuse device region.

6. The semiconductor structure of claim 3, further comprising:
 a third doped region, disposed in the substrate of the anti-fuse device region, and located on another side of the first dielectric layer of the anti-fuse device region.

7. The semiconductor structure of claim 6, further comprising:
a fourth doped region, disposed in the substrate of the anti-fuse device region; wherein the third doped region disposed in the fourth doped region.

8. The semiconductor structure of claim 7, wherein the first doped region and the third doped region are both N-type doped regions, and the second doped region and the fourth doped region are both N-wells.

9. The semiconductor structure of claim 6, wherein the third doped region is in contact with the first dielectric layer of the anti-fuse device region.

10. The semiconductor structure of claim 3, further comprising: a fifth doped region, a sixth doped region and a seventh doped region;
wherein the seventh doped region is disposed in the substrate of the core device region, the fifth doped region and the sixth doped region are disposed in the seventh doped region, and the fifth doped region and the sixth doped region are located respectively on two sides of the first dielectric layer of the core device region.

11. The semiconductor structure of claim 10, wherein the fifth doped region and the sixth doped region are both N-type doped regions, the seventh doped region is P-well, and the fifth doped region and the sixth doped region are both in contact with the first dielectric layer of the core device region.

12. The semiconductor structure of claim 1, wherein the second dielectric layer is a high dielectric constant layer having a dielectric constant of 10 to 100.

13. The semiconductor structure of claim 12, wherein a material of the first dielectric layer comprises silicon oxide, silicon nitride or silicon oxynitride, and a material of the second dielectric layer comprises zirconium oxide or hafnium oxide.

14. The semiconductor structure of claim 13, wherein the first dielectric layer has a thickness of 0.5 nm to 50 nm, and the second dielectric layer has a thickness of 2 nm to 50 nm.

15. The semiconductor structure of claim 1, further comprising:
side walls, disposed on side surfaces of the first dielectric layer and the conductive layer of the anti-fuse device region, and on side surfaces of the first dielectric layer, the second dielectric layer and the conductive layer of the core device region.

16. The semiconductor structure of claim 1, wherein an upper surface of the conductive layer of the anti-fuse device region is flush with an upper surface of the conductive layer of the core device region.

17. A semiconductor structure, comprising:
a core device region and an anti-fuse device region, disposed on a same substrate;
a first dielectric layer, disposed on the substrate of the core device region and the anti-fuse device region, wherein the first dielectric layer has a first dielectric constant;
a second dielectric layer, disposed on the first dielectric layer of the core device region; and
a conductive layer, disposed on the second dielectric layer of the core device region and the first dielectric layer of the anti-fuse device region, wherein the second dielectric layer has a dielectric constant larger than the first dielectric constant;
the semiconductor structure further comprising:
a first doped region, disposed in the substrate of the anti-fuse device region, and located on one side of the first dielectric layer of the anti-fuse device region;
a second doped region, located in the substrate of the anti-fuse device region; wherein the first doped region is disposed in the second doped region;
a third doped region, disposed in the substrate of the anti-fuse device region, and located on another side of the first dielectric layer of the anti-fuse device region; and
a fourth doped region, disposed in the substrate of the anti-fuse device region; wherein the third doped region disposed in the fourth doped region.

18. A semiconductor structure, comprising:
a core device region and an anti-fuse device region, disposed on a same substrate;
a first dielectric layer, disposed on the substrate of the core device region and the anti-fuse device region, wherein the first dielectric layer has a first dielectric constant;
a second dielectric layer, disposed on the first dielectric layer of the core device region; and
a conductive layer, disposed on the second dielectric layer of the core device region and the first dielectric layer of the anti-fuse device region, wherein the second dielectric layer has a dielectric constant larger than the first dielectric constant;
the semiconductor structure further comprising:
a first doped region, disposed in the substrate of the anti-fuse device region, and located on one side of the first dielectric layer of the anti-fuse device region;
a second doped region, located in the substrate of the anti-fuse device region; wherein the first doped region is disposed in the second doped region;
a fifth doped region, a sixth doped region and a seventh doped region;
wherein the seventh doped region is disposed in the substrate of the core device region, the fifth doped region and the sixth doped region are disposed in the seventh doped region, and the fifth doped region and the sixth doped region are located respectively on two sides of the first dielectric layer of the core device region.

* * * * *